(12) United States Patent
Nam et al.

(10) Patent No.: US 9,171,885 B2
(45) Date of Patent: Oct. 27, 2015

(54) INFRARED DETECTOR AND INFRARED IMAGE SENSOR INCLUDING THE SAME

(71) Applicant: Samsung Electronics Co., Ltd., Suwon-Si, Gyeonggi-Do (KR)

(72) Inventors: Sung-hyun Nam, Yongin-si (KR); Sook-young Roh, Suwon-si (KR); Hae-seok Park, Yongin-si (KR); Seok-ho Yun, Hwaseong-si (KR); Hyun-gue Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/143,442

(22) Filed: Dec. 30, 2013

(65) Prior Publication Data

US 2014/0246749 A1 Sep. 4, 2014

(30) Foreign Application Priority Data

Jan. 10, 2013 (KR) .................. 10-2013-0003139

(51) Int. Cl.
*G01N 21/35* (2014.01)
*H01L 27/16* (2006.01)
*H01L 35/32* (2006.01)
*G01J 5/12* (2006.01)
*G01J 5/08* (2006.01)

(52) U.S. Cl.
CPC ............. *H01L 27/16* (2013.01); *G01J 5/0853* (2013.01); *G01J 5/12* (2013.01); *H01L 35/325* (2013.01)

(58) Field of Classification Search
CPC ............. G01N 21/3581; G01N 33/553; G02F 2202/30; G02F 1/218; G02F 2203/13; G01J 5/0853; G01J 5/20; G01J 3/0259; G01J 3/2803; G01J 3/36; G01J 5/046; G01J 5/12
See application file for complete search history.

(56) References Cited

U.S. PATENT DOCUMENTS

| | | | |
|---|---|---|---|
| 2006/0175551 A1* | 8/2006 | Fan et al. | 250/353 |
| 2010/0032788 A1 | 2/2010 | Ulbrich | |
| 2010/0127172 A1* | 5/2010 | Nikoobakht | 250/332 |
| 2011/0174978 A1 | 7/2011 | Forg et al. | |
| 2012/0104258 A1* | 5/2012 | Boutami et al. | 250/349 |

FOREIGN PATENT DOCUMENTS

| | | |
|---|---|---|
| JP | 2004-085331 A | 3/2004 |
| JP | 2007-198852 A | 8/2007 |
| KR | 2008-0085798 A | 9/2008 |

\* cited by examiner

*Primary Examiner* — Roy Potter
*Assistant Examiner* — Paul Patton
(74) *Attorney, Agent, or Firm* — Harness, Dickey & Pierce, P.L.C.

(57) ABSTRACT

An infrared detector includes at least one infrared absorber provided on a substrate and a plurality of thermocouples. The at least one infrared absorber may include one of a plasmonic resonator and a metamaterial resonator. The plurality of thermocouples may be configured to generate electromotive forces in response to thermal energy generated by the at least one infrared absorber.

20 Claims, 7 Drawing Sheets

INFRARED DETECTOR AND INFRARED IMAGE SENSOR INCLUDING THE SAME

CROSS-REFERENCE TO RELATED APPLICATIONS

This application claims the benefit of Korean Patent Application No. 10-2013-0003139, filed on Jan. 10, 2013, in the Korean Intellectual Property Office, the disclosure of which is incorporated herein in its entirety by reference.

BACKGROUND

1. Field

Example Embodiments relate to infrared detectors and infrared image sensors, and more particularly, to a thermopile type infrared detector and an infrared image sensor including the same.

2. Description of the Related Art

An object having a certain temperature emits light in a particular wavelength band in accordance with black body radiation. Peripheral objects at room temperature emit infrared rays in wavelength bands ranging from about 8 to about 14 µm. To detect these emitted infrared rays, uncooled infrared detectors are frequently used. Generally, uncooled infrared detectors may be classified into bolometer type infrared detectors that use a resistance change of a material according to infrared rays incident thereon, pyroelectric infrared detectors using a polar change of a material according to infrared rays incident thereon, and thermopile type infrared detectors using an electromotive force change of a material according to infrared rays incident thereon. Bolometer type infrared detectors capable of easily integrating a lot of pixels in a small area are generally applied in fields where high resolution is required. On the other hand, thermopile type infrared detectors are easily manufactured and generally employed in fields where relatively inexpensive devices can be used and a small number of pixels are required.

Thermopile type infrared detectors including a plurality of thermocouples connected in series measure an electromotive force generated due to a difference between temperatures of a hot junction and a cold junction by using a thermoelectric effect. A thermopile type infrared detector includes an infrared absorber that absorbs light having a wavelength in an infrared band and converts the absorbed light into heat. An amount of the light absorbed by the infrared absorber is proportional to an area of the infrared absorber, and the heat is generated in response to the light absorption. Generally, it is possible to absorb a lot of energy of the incident light by increasing a filling factor of the infrared absorber. However, since the infrared absorber transfers heat only to a hot junction, an effective distance between the hot junction and a cold junction becomes shorter as a size of the infrared absorber increases. Accordingly, a thermal loss of the infrared absorber increases, which thus limits the increase of the filling factor.

SUMMARY

Example embodiments are directed to thermopile type infrared detectors and infrared image sensors including the same.

Additional aspects will be set forth in part in the description which follows and, in part, will be apparent from the description, or may be learned by practice of the presented example embodiments.

According to an example embodiment, an infrared detector includes at least one infrared absorber provided on a substrate and including one of a plasmonic resonator and a metamaterial resonator, and a plurality of thermocouples receiving thermal energy generated by the at least one infrared absorber and generating electromotive forces in response thereto.

One of a cavity and a penetration hole may be formed in the substrate to a certain depth. The infrared detector may further include a mirror layer provided in the cavity and reflecting an infrared ray incident thereon. The mirror layer may be provided on a bottom surface of the cavity.

The substrate may be formed as a single body. On the other hand, the substrate may include a first substrate and a second substrate provided on the first substrate and including the cavity.

The at least one infrared absorber may include a plurality of infrared absorbers separated from one another, and the plurality of thermocouples may be provided between the plurality of infrared absorbers to connect the same to one another. In this case, at least one post may be provided inside one of the cavity and the penetration hole to support connection parts of the plurality of thermocouples. Cold junctions of the plurality of thermocouples may be located on the at least one post.

At least one thermal conductive layer may be further provided between the at least one infrared absorber and the plurality of thermocouples and may transfer thermal energy generated by the at least one infrared absorber to the plurality of thermocouples. One infrared absorber may be provided on one thermal conductive layer. Also, a plurality of infrared absorbers may be provided on one thermal conductive layer.

The thermal conductive layer may include one of a thermal conductive insulating material and a metal. A support layer supporting the plurality of thermocouples and the at least one thermal conductive layer may be provided on the substrate.

The at least one infrared absorber may be provided to be in direct contact with the plurality of thermocouples. Also, a support layer supporting the at least one infrared absorber and the plurality of thermocouples may be further provided on the substrate.

The one of the plasmonic resonator and the metamaterial resonator may include at least one metal material selected from the group consisting of Au, Ti, Al, Cu, Pt, Ag, Ni, and Cr. The plurality of thermocouples may be connected in series.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
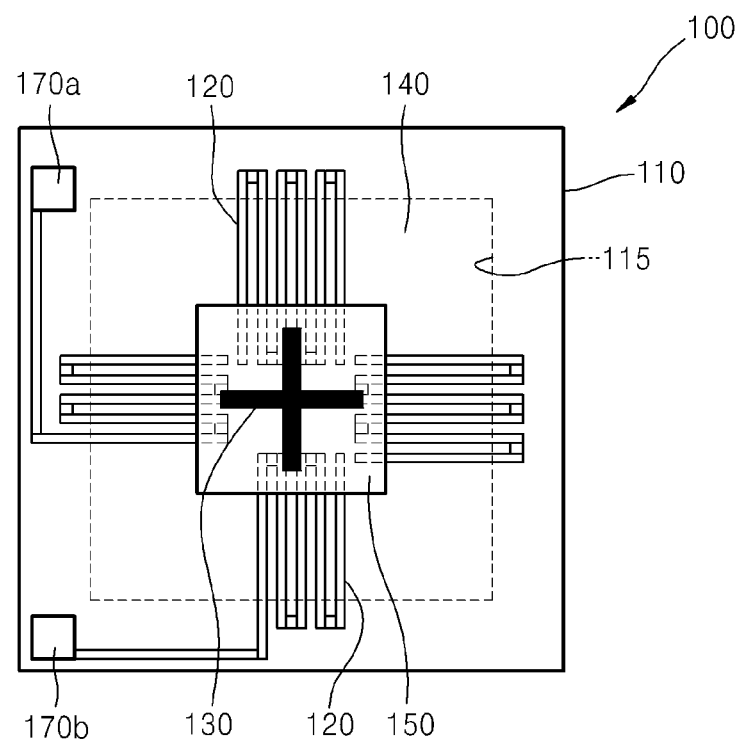
FIG. 1 is a top view illustrating an infrared detector according to an example embodiment.

Reference will now be made in detail to example embodiments, examples of which are illustrated in the accompanying drawings, wherein like reference numerals refer to the like elements throughout and a size or a thickness of each element may be exaggerated for clarity of description. In this regard, example embodiments may have different forms and should not be construed as being limited to the descriptions set forth herein. Accordingly, the example embodiments described below, by referring to the figures, are to explain aspects of the present description. Expressions such as "at least one of," when preceding a list of elements, modify the entire list of elements and do not modify the individual elements of the list.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

Figure 2:
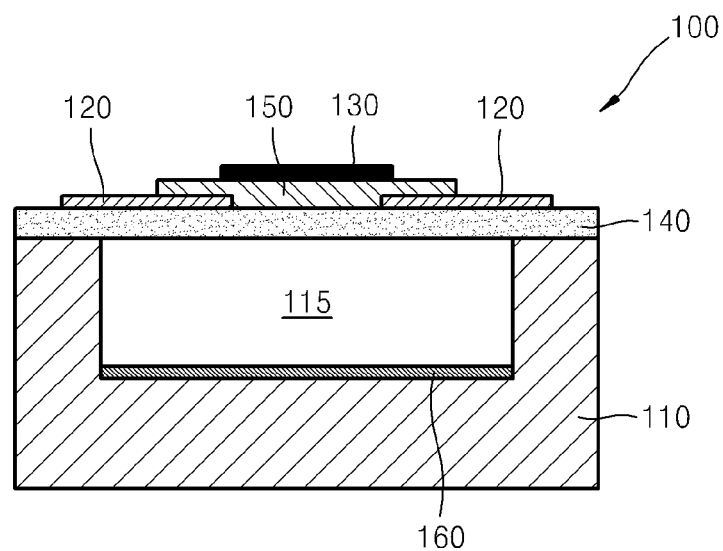
FIG. 2 is a cross-sectional view illustrating the infrared detector of FIG. 1.

FIG. 1 is a top view illustrating an infrared detector 100 according to an example embodiment, and FIG. 2 is a cross-sectional view illustrating the infrared detector 100.

Referring to FIGS. 1 and 2, the infrared detector 100 includes a substrate 110, an infrared absorber 130 absorbing infrared rays and generating heat energy, and a plurality of thermocouples 120 receiving the thermal energy from the infrared absorber 130 and generating electromotive forces in response thereto. A cavity 115 is formed in the substrate 110 to a certain depth. The cavity 115 may be in a vacuum state or may be filled with air or another gas having a low heat transfer coefficient. In this case, the shape and depth of the cavity 115 may be variously changed. The substrate 110 may function as a heat sink. The substrate 110, for example, may include silicon but is not limited thereto and may also include other various materials.

A support layer 140 may be provided on the substrate 110 to cover the cavity 115. The support layer 140 may support the plurality of thermocouples 120 and a thermal conductive layer 150 that will be described below. The support layer 140 may include a material having low heat conductivity. In this case, heat resistances between hot junctions and cold junctions of the plurality of thermocouples 120 provided thereon may increase. The support layer 140, for example, may include silicon nitrides but is not limited thereto. The plurality of thermocouples 120 is arranged on the support layer 140. In this case, the thermocouples 120 may be connected in series. Each of the plurality of thermocouples 120 may include a hot junction and a cold junction provided on both ends. In this case, electromotive forces occur due to a difference between temperatures of the hot junctions and cold junctions. Each of the plurality of thermocouples 120 may include n-type silicon and p-type silicon but is not limited thereto. On the other hand, a pair of electric pads 170a and 170b for outputting the electromotive forces generated by the plurality of thermocouples 120 may be provided on the support layer 140.

The thermal conductive layer 150 transferring heat energy generated from the infrared absorber 130 to the plurality of thermocouples 120 may be further provided on the support layer 140. The infrared absorber 130 is provided on a top surface of the thermal conductive layer 150 in such a way that an edge of the thermal conductive layer 150 is in contact with the hot junctions of the plurality of thermocouples 120. The thermal conductive layer 150 uniformly transfer heat energy generated from the infrared absorber 130 to the hot junctions of the plurality of thermocouples 120. The thermal conductive layer 150, for example, may include a thermal conductive insulating material but is not limited thereto. Alternatively, the thermal conductive layer 150 may include a metal depending on a design condition of the infrared absorber 130.

The thermal conductive layer 150 may have a minimum size to allow transfer of the heat energy to the hot junctions of the plurality of thermocouples 120 in order to reduce a thermal mass as much as possible.

The infrared absorber 130 absorbing infrared rays incident thereon and generating heat energy is provided on the thermal conductive layer 150. The infrared absorber 130 may be located above the cavity 115 formed in the substrate 110.

The infrared absorber 130 may include one of a plasmonic resonator and a metamaterial resonator. Generally, a sensitivity of a thermopile type infrared detector is determined according to the equation:

$$R = n \times \alpha \times Rth \times \eta, \quad \text{(Eq. 1)}$$

Where, R is the sensitivity of an infrared detector (i.e., an amount of generated voltage/power due to the incident light), n is the number of used thermocouples, α is the Seebeck constant, Rth is the thermal resistance between hot junctions and cold junctions, and η, is an infrared absorption rate of an infrared absorber.

One of the plasmonic resonator and the metamaterial resonator is used as the infrared absorber 130, thereby increasing the infrared absorption rate η, and thus increasing the sensitivity of the thermopile type infrared detector 100. One of the plasmonic resonator and the metamaterial resonator may absorb infrared rays via a local surface-plasmonic resonance in a wavelength band of interest, for example, in an infrared wavelength band within a range from about 8 to about 14 μm. By using one of the plasmonic resonator and the metamaterial resonator as the infrared absorber 130, an optical absorption cross-sectional area becomes greater than a geometric absorption unit area, thereby obtaining a relatively high infrared absorption rate although the infrared absorber 130 has a relatively small size. By using one of the plasmonic resonator and the metamaterial resonator as the infrared absorber 130, the optical absorption cross-sectional area may be greater, for example, five times than the geometric absorption unit area but is not limited thereto.

One of the plasmonic resonator and the metamaterial resonator may include a metal. For example, one of the plasmonic resonator and the metamaterial resonator may include at least one metallic material selected from the group consisting of Au, Ti, Al, Cu, Pt, Ag, Ni, and Cr. However, example embodiments are not limited thereto and one of the plasmonic resonator and the metamaterial resonator may have various structures capable of absorbing energy of infrared rays incident thereon as much as possible.

In FIG. 1, one of the plasmonic resonator and the metamaterial resonator used as the infrared absorber 130 having a cross structure in which two bars reciprocally cross over each other is shown as an example. In this case, one of the plasmonic resonator and the metamaterial resonator may have one resonance centric wavelength within a wavelength band of interest. On the other hand, when one of the plasmonic resonator and the metamaterial resonator has a structure in which a plurality of bars having different lengths from one another is horizontally and vertically arranged, one of the plasmonic resonator and the metamaterial resonator may have two or more resonance centric wavelength bands in the wavelength band of interest. Therefore, the absorbed infrared energy may increase. In addition, one of the plasmonic resonator and the metamaterial resonator may have other various structures.

As illustrated in FIG. 2, a mirror layer 160 may be provided in the cavity 115 formed in the substrate 110. The mirror layer 160 may be further provided on a bottom surface of the cavity 115. The mirror layer 160 reflects incident infrared rays toward the infrared absorber 130 and 160 may include a material having a high infrared-reflection rate, for example, a metal, but is not limited thereto. The mirror layer 160 may have a thickness that prevents transmission of an infrared ray.

The mirror layer 160, for example, may have a thickness of about 200 nm or more, but is not limited thereto. However, the mirror layer 160 may be provided on other surfaces of the cavity 115.

Figure 3:
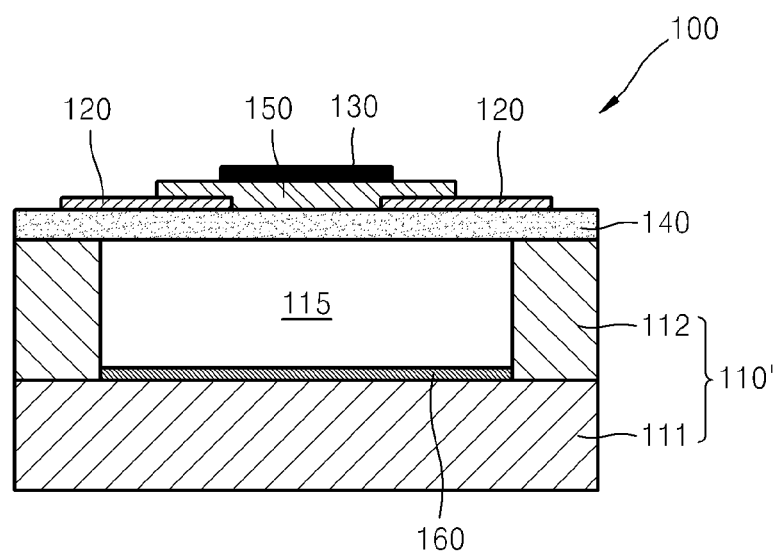
FIG. 3 is a view illustrating the infrared detector including another substrate different from that shown in FIG. 1.
Figure 4A:
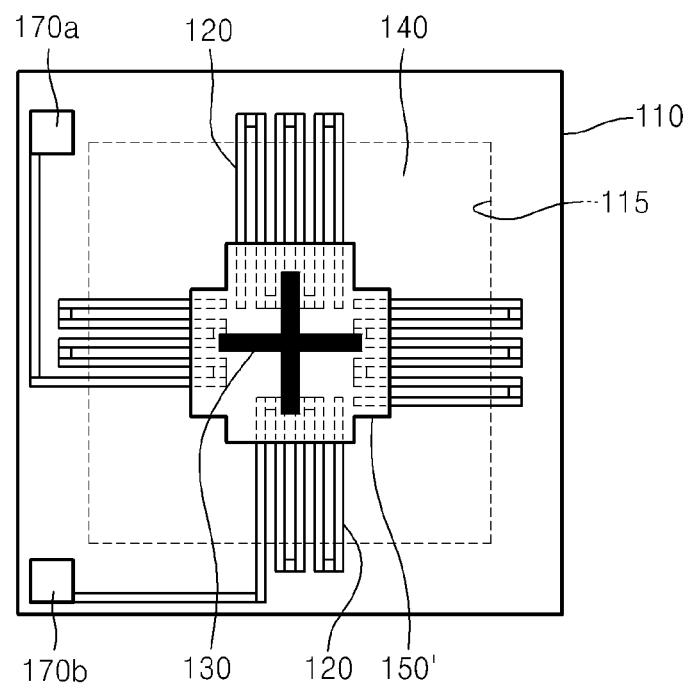
FIGS. 4A and 4B are views illustrating the infrared detector including another thermal conductive layer different from that shown in FIG. 1.
Figure 4B:
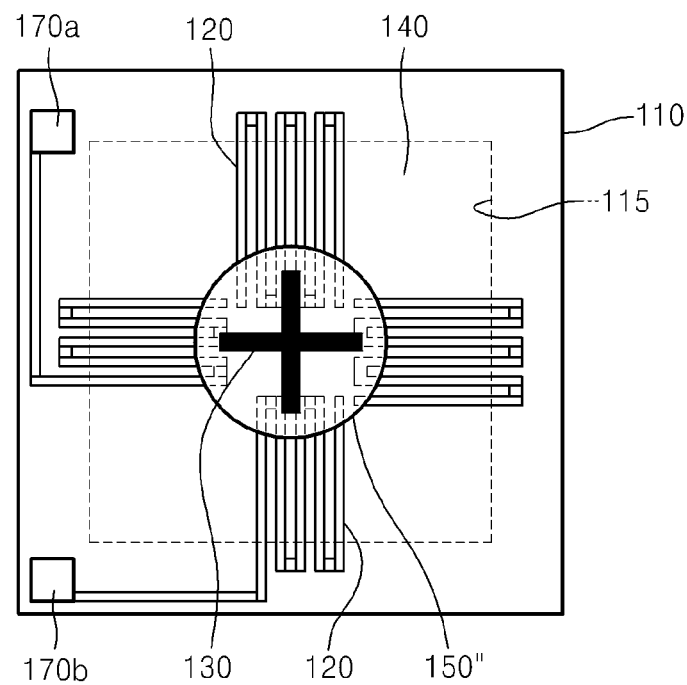

FIGS. 3 and 4 are views illustrating the infrared detector including another substrate and another thermal conductive layer, respectively.

Referring to FIGS. 1-5, in FIG. 1, the substrate 110 may be formed as a single body. On the other hand, as shown in FIG. 3, a substrate 110' may include a first substrate 111 and a second substrate 112 provided on the first substrate 111. In this case, the cavity 115 is formed in the second substrate 112.

Figure 5:
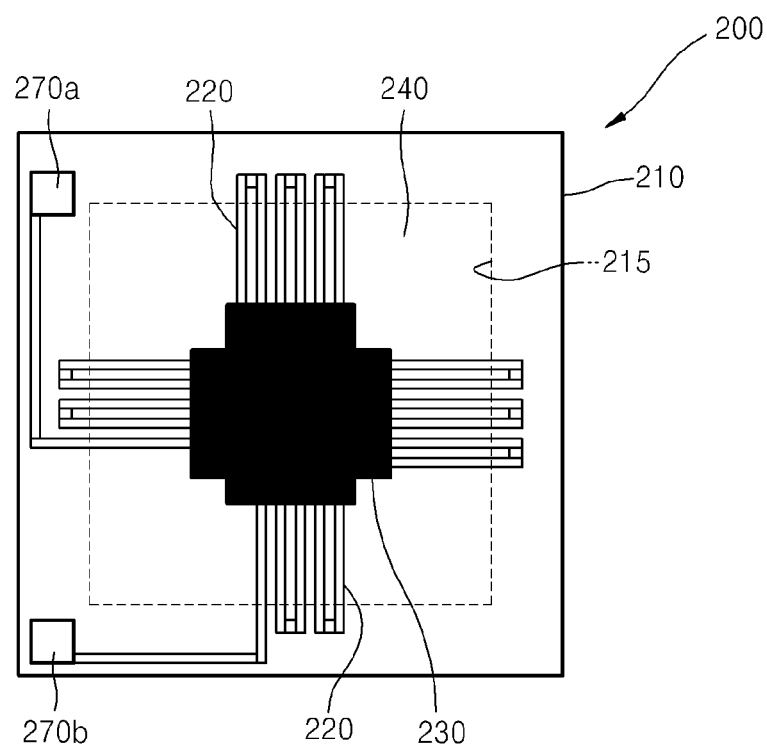
FIG. 5 is a top view illustrating an infrared detector according to another example embodiment.

In FIG. 1, the thermal conductive layer 150 has a tetragonal shape as an example. However, the thermal conductive layer 150 may have various shapes. For example, as illustrated in FIG. 4, a thermal conductive layer 150' may have a cross shape. Further, as illustrated in FIG. 5, a thermal conductive layer 150'' may have a circular shape. However, these are merely examples and the thermal conductive layer 150 may have other various shapes.

As described above, the thermopile type infrared detector 100 includes one of the plasmonic resonator and the metamaterial resonator as the infrared absorber 130, thereby having improved infrared absorption rate and sensitivity. Also, when manufacturing an infrared image sensor by using a plurality of the infrared detectors 100, thermal images having relatively high quality may be obtained. The infrared detector 100 may detect heat energy generated by absorbing infrared rays. On the other hand, it has been described above as an example that the wavelength band of interest is an infrared wavelength band. However, example embodiments are not limited thereto. The infrared detector 100 may be used to detect a terahertz wavelength, and thus, terahertz detectors and terahertz image sensors may be fabricated.

Figure 6:
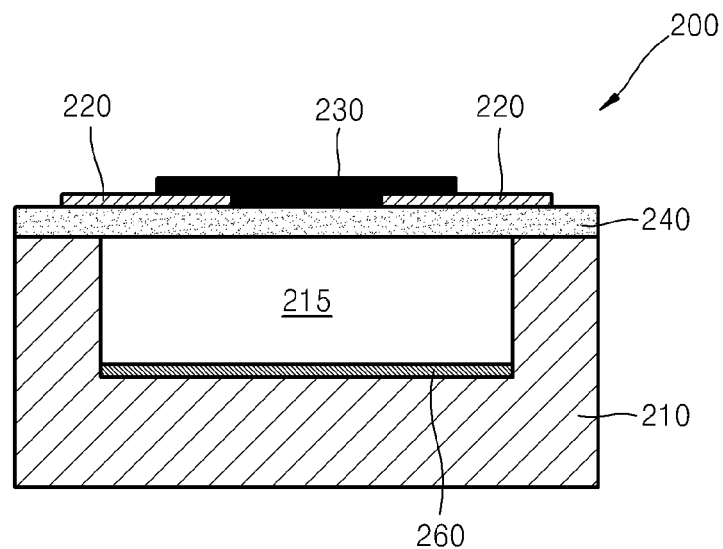
FIG. 6 is a cross-sectional view illustrating the infrared detector of FIG. 5.

FIG. 5 is a top view illustrating a thermopile type infrared detector 200 according to another example embodiment. FIG. 6 is a cross-sectional view illustrating the infrared detector 200. Hereinafter, differences from the previous example embodiment will be described.

Referring to FIGS. 5 and 6, the infrared detector 200 includes a substrate 210 in which a cavity 215 is formed to a certain depth, an infrared absorber 230 absorbing infrared rays and generating heat energy in response thereto, and a plurality of thermocouples 220 receiving heat energy from the infrared absorber 230 and generating electromotive forces in response thereto.

The cavity 215 formed in the substrate 210 may be, for example, in a vacuum state or may be filled with air or other gas having a low heat transfer coefficient. The substrate 210, for example, may include silicon but is not limited thereto, and may include various materials. The substrate 210 may be formed as a single body. However, similar to the structure of FIG. 3, the substrate 210 may include first and second substrates (not shown).

A support layer 240 supporting the plurality of thermocouples 220 and the infrared absorber 230 may be provided on the substrate 210. The support layer 240 may include a material having low thermal conductivity, for example, silicon nitrides, but is not limited thereto. The plurality of thermocouples 220 connected in series is arranged on the support layer 240. Each of the plurality of thermocouples 220 may include a hot junction and a cold junction provided on both ends thereof. A pair of electric pads 270a and 270b for outputting the electric forces generated from the plurality of thermocouples 220 may be provided on the support layer 240.

The infrared absorber 230 absorbing incident infrared rays and generating heat energy is provided on the support layer

240. The infrared absorber 230 may be located above the cavity 215 formed on the substrate 210. In this case, the infrared absorber 230 may be provided such that an edge thereof is in direct contact with the plurality of thermocouples 220, that is, with the hot junctions thereof. Accordingly, the heat energy generated from the infrared absorber 230 may be directly transferred to the hot junctions of the plurality of thermocouples 220.

The infrared absorber 230 may include one of a plasmonic resonator and a metamaterial resonator. As described above, when one of the plasmonic resonator and the metamaterial resonator is used as the infrared absorber 230, an infrared absorption rate may increase, and accordingly, the sensitivity of the infrared detector 200 may improve. The infrared absorber 230 may have various structures depending on design requirements. In FIG. 5, the infrared absorber 230 has a cross structure as an example. However, the infrared absorber 230 may have other various structures.

A mirror layer 260 may be provided on a bottom surface of the cavity 215 formed in the substrate 210. The mirror layer 260 reflects incident infrared rays toward the infrared absorber 230. The mirror layer 260 may include a material having infrared reflection rate, for example, a metal, but is not limited thereto. The mirror layer 260 may have a thickness that prevents transmission of an infrared ray, for example, of about 200 nm or more, but is not limited thereto. On the other hand, the support layer 240 may not be provided on the substrate 210.

Figure 7:
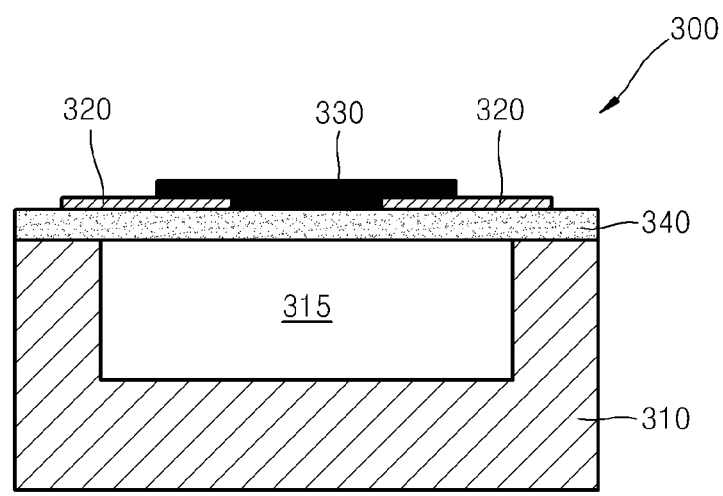
FIG. 7 is a cross-sectional view illustrating an infrared detector according to another example embodiment.

FIG. 7 is a cross-sectional view illustrating a thermopile infrared detector 300 according to another example embodiment. The infrared detector 300 has the same structure as the infrared detector 200 except that a mirror layer is not provided on a bottom surface of a cavity 315 formed in a substrate 310.

Referring to FIG. 7, the infrared detector 300 includes the substrate 310 in which the cavity 315 is formed to a certain depth, an infrared absorber 330 absorbing infrared rays and generating heat energy in response thereto, and a plurality of thermocouples 320 receiving the heat energy from the infrared absorber 330 and generating electromotive forces in response thereto. The substrate 310 may be formed as a single body. However, similar to the structure in FIG. 3, the substrate 310 may be formed of first and second substrate (not shown).

A support layer 340 supporting the plurality of thermocouples 320 and the infrared absorber 330 may be provided on the substrate 310. The plurality of thermocouples 320 connected in series is arranged on the support layer 340. Each of the plurality of thermocouples 320 includes a hot junction and a cold junction provided on both ends thereof. Also, a pair of electric pads (not shown) for outputting the electric forces generated from the plurality of thermocouples 320 may be provided on the support layer 340.

The infrared absorber 330 absorbing incident infrared rays and generating heat energy is provided on the support layer 340. The infrared absorber 330 may be located above the cavity 315 formed on the substrate 310. In this case, the infrared absorber 330 may be provided such that an edge thereof is in direct contact with the plurality of thermocouples 320, that is, with the hot junctions thereof.

Figure 9:
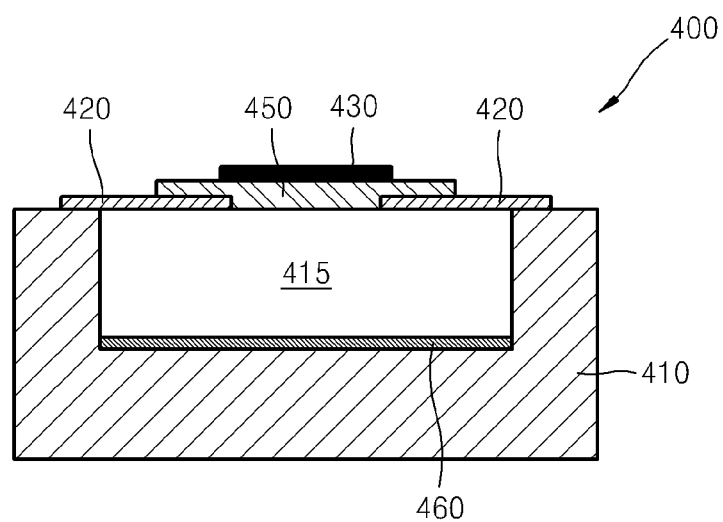
FIG. 9 is a cross-sectional view illustrating an infrared detector according to another example embodiment.

The infrared absorber 330 may include one of a plasmonic resonator and a metamaterial resonator. The infrared absorber 330 may have various structures depending on design requirements. On the other hand, the support layer 330 may not be provided on the substrate 310, as shown in FIG. 9.

Since a mirror layer is not provided on the bottom surface of the cavity 315 in the infrared detector 300, a sensitivity thereof may be lower than that of the infrared detector 200 of FIG. 6 but a process of manufacturing the infrared detector may be simplified.

Figure 8:
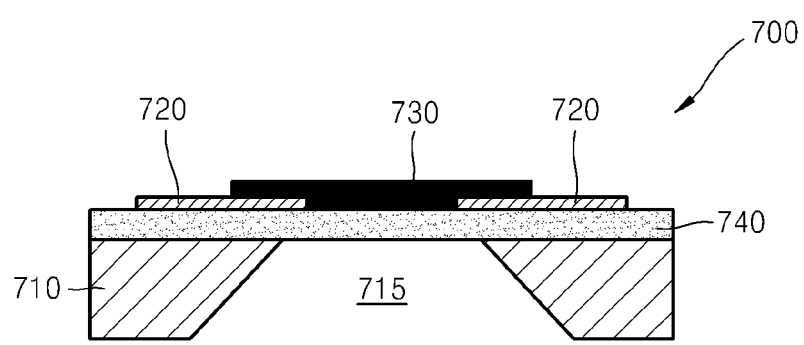
FIG. 8 is a cross-sectional view illustrating an infrared detector according to another example embodiment.

FIG. 8 is a cross-sectional view illustrating a thermopile type infrared detector 700 according to another example embodiment. The infrared detector 700 has the same structure as the infrared detector 300 shown in FIG. 7 except that a penetration hole 715 is formed in a substrate 710 instead of a cavity.

Referring to FIG. 8, the infrared detector 700 includes the substrate 710 in which the penetration hole 715 is formed, an infrared absorber 730 absorbing infrared rays and generating heat energy in response thereto, and a plurality of thermocouples 720 receiving heat energy from the infrared absorber 730 and generating electromotive forces in response thereto. A support layer 740 formed of a material having low thermal conductivity and supporting the plurality of thermocouples 720 and the infrared absorber 730 may be provided on the substrate 710. The plurality of thermocouples 320 connected in series is arranged on the support layer 740. Each of the plurality of thermocouples 720 includes a hot junction and a cold junction provided on both ends thereof. A pair of electric pads (not shown) for outputting the electric forces generated from the plurality of thermocouples 720 may be provided on the support layer 740.

The infrared absorber 730 absorbing incident infrared rays and generating heat energy is provided on the support layer 740. The infrared absorber 330 may be located above the penetration hole 715 formed in the substrate 710. In this case, the infrared absorber 730 may be provided such that an edge thereof is in direct contact with the plurality of thermocouples 720, that is, with the hot junctions thereof. The infrared absorber 730 may include one of a plasmonic resonator and a metamaterial resonator. The infrared absorber 730 may have various structures depending on design requirements. On the other hand, although not shown in the drawings, a thermal conductive layer 750 transferring the heat energy generated from the infrared absorber 730 toward the plurality of thermocouples 720 may be provided between the infrared absorber 730 and the plurality of thermocouples 720. The support layer 740 may not be provided on the substrate 710 as shown in FIG. 9.

FIG. 9 is a cross-sectional view illustrating a thermopile type infrared detector 400 according to another example embodiment. The infrared detector 400 shown in FIG. 9 has the same structure as the infrared detector 100 shown in FIG. 2 except that a support layer is not provided on a substrate 410.

Referring to FIG. 9, the infrared detector 400 includes the substrate 410 in which a cavity 315 is formed to a certain depth, an infrared absorber 430 absorbing infrared rays and generating heat energy in response thereto, and a plurality of thermocouples 420 receiving the heat energy from the infrared absorber 430 and generating electromotive forces in response thereto. The substrate 410 may be formed as a single body. However, similar to the structure shown in FIG. 3, the substrate 410 may be formed of first and second substrate (not shown).

The plurality of thermocouples 420 connected in series is arranged on the substrate 410. Each of the plurality of thermocouples 420 includes a hot junction and a cold junction provided on both ends thereof. In this case, the cold junctions of the plurality of thermocouples 420 are in contact with an edge of a top surface of the substrate 410. Also, the hot junctions of the plurality of thermocouples 420 are in contact with a thermal conductive layer 450 that will be described below. A pair of electric pads (not shown) for outputting electromotive the forces generated from the plurality of thermocouples 420 may be provided on the edge of the top surface of the substrate.

The infrared absorber 430 absorbing incident infrared rays and generating heat energy is provided above the cavity 415 of the substrate 410. The infrared absorber 430 may include one of a plasmonic resonator and a metamaterial resonator. The infrared absorber 430 may have various structures depending on design requirements. Also, the thermal conductive layer 450 transferring the heat energy generated from the infrared absorber 430 to the plurality of thermocouples 420 is provided between the infrared absorber 430 and the plurality of thermocouples 420. In this case, an edge of the thermal conductive layer 450 may be in contact with the hot junctions of the plurality of thermocouples 420. The thermal conductive layer 450 uniformly transfers the heat energy generated from the infrared absorber 430 to the hot junctions of the plurality of thermocouples 420. The thermal conductive layer 450 may include, for example, a thermal conductive material but is not limited thereto. The thermal conductive layer 450 may include a metal according to the design requirements of the infrared absorber 430. The thermal conductive layer 450 may have various shapes.

A mirror layer 460 may be provided on a bottom surface of the cavity 415 formed on the substrate 410. The mirror layer 460 reflects incident infrared rays toward the infrared absorber 430. The mirror layer 460 may include a material having a high infrared reflection rate, for example, a metal, but is not limited thereto. The mirror layer 460 may have, for example, a thickness of about 200 nm or more, but is not limited thereto. The mirror layer 460 may be provided on other surfaces of the cavity 415.

Figure 10:
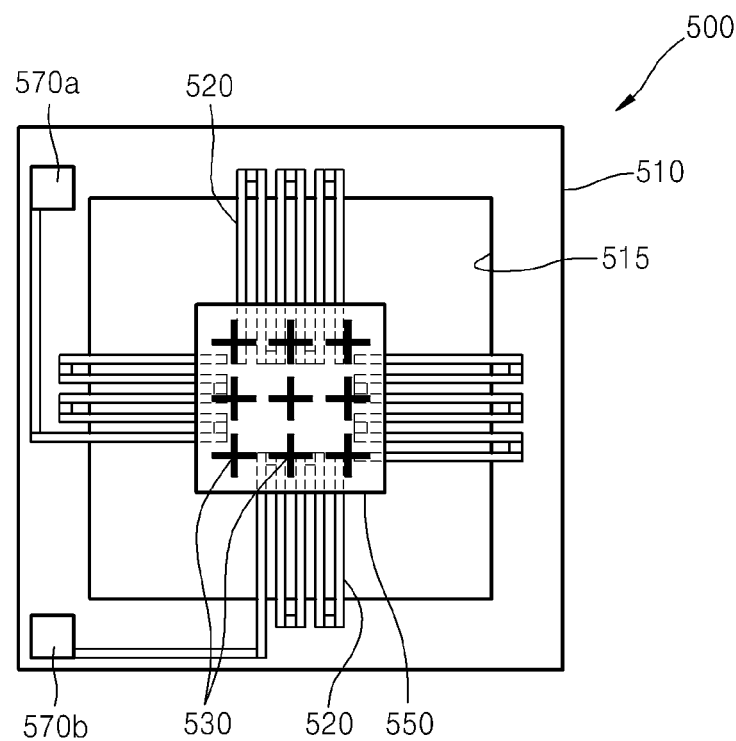
FIG. 10 is a top view illustrating an infrared detector according to another example embodiment.

FIG. 10 is a top view illustrating a thermopile type infrared detector 500 according to another example embodiment. The infrared detector 500 is similar to the embodiments described above except including a plurality of infrared absorbers 530.

Referring to FIG. 10, the infrared detector 500 includes a substrate 510 in which a cavity 515 is formed to a certain depth, the plurality of infrared absorbers 530 absorbing infrared rays and generating heat energy in response thereto, and a plurality of thermocouples 520 receiving the heat energy from the plurality of infrared absorbers 530 and generating electromotive forces in response thereto. A mirror layer (not shown) reflecting infrared rays may be provided on a bottom surface of the cavity 515 formed on the substrate 510. The substrate 510 may be formed as a single body. However, similar to the structure in FIG. 3, the substrate 510 may be formed of first and second substrate (not shown). Rather than the cavity 515, a penetration hole (not shown) may be formed in the substrate 510 in a manner similar to the structure shown in FIG. 8.

The plurality of thermocouples 520 connected in series is arranged on the substrate 510. Each of the plurality of thermocouples 520 includes a hot junction and a cold junction provided on both ends thereof. In this case, the cold junctions of the plurality of thermocouples 520 are in contact with an edge of a top surface of the substrate 510. Also, the hot junctions of the plurality of thermocouples 520 are in contact with a thermal conductive layer 550 that will be described below. A pair of electric pads 570a and 570b for outputting electromotive forces generated from the plurality of thermocouples 520 may be provided on the edge of the top surface of the substrate 510.

The plurality of infrared absorbers 530 absorbing incident infrared rays and generating heat energy are provided above the cavity 515 of the substrate 510. Each of the plurality of infrared absorbers 530 may include one of a plasmonic resonator and a metamaterial resonator. Each of the plurality of infrared absorbers 530 may have various structures depending on design requirements. In FIG. 10, for example, each of the plurality of infrared absorbers 530 has a cross structure.

Also, the thermal conductive layer 550 transferring the heat energy generated from the plurality of infrared absorbers 530 to the plurality of thermocouples 420 is provided between the plurality of infrared absorbers 530 and the plurality of thermocouples 520. In this case, an edge of the thermal conductive layer 550 may be in contact with the hot junctions of the plurality of thermocouples 520. The thermal conductive layer 550 uniformly transfers the heat energy generated from the plurality of infrared absorber 530 to the hot junctions of the plurality of thermocouples 520. The thermal conductive layer 550, for example, may include a thermal conductive material but is not limited thereto. The thermal conductive layer 550 may include a metal. The thermal conductive layer 550 may have various shapes. On the other hand, although not shown in FIG. 10, a support layer supporting the thermal conductive layer 550 and the plurality of thermocouples 520 may be provided on the substrate 510.

The infrared detector 500 includes the plurality of infrared absorbers 530, each of which includes one of the plasmonic resonator and the metamaterial resonator. Accordingly, an optical absorption cross-sectional area is further enlarged, and thus, an optical absorption rate of the infrared detector 500 is increased. Accordingly, the infrared detector 500 may have pixels that are smaller than general pixels and have a size of, for example, 100×100 μm2.

Figure 11:
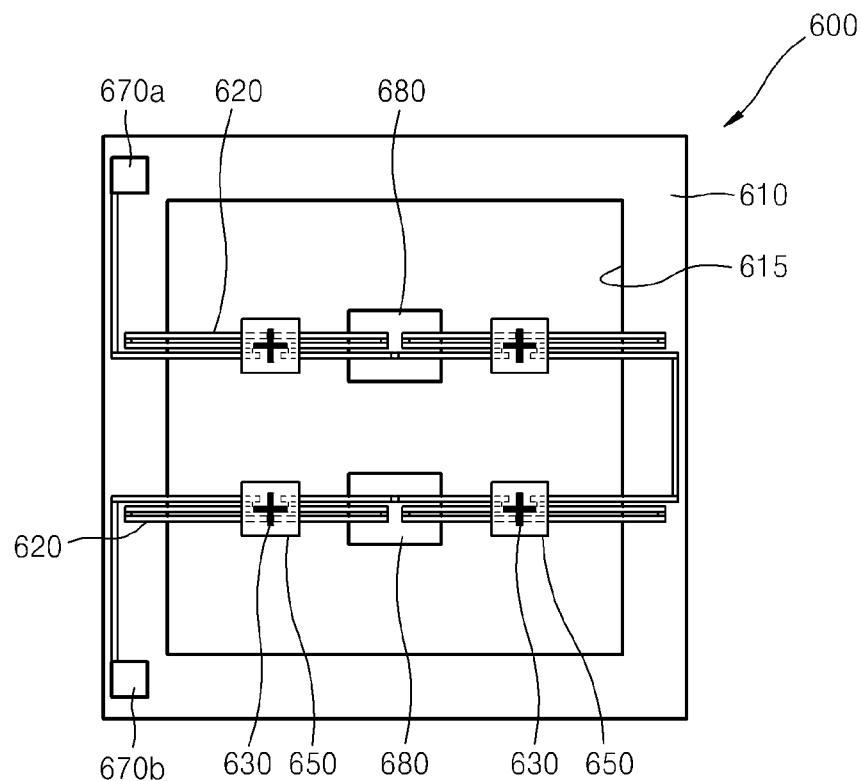
FIG. 11 is a top view illustrating an infrared detector according to another example embodiment.
Figure 12:
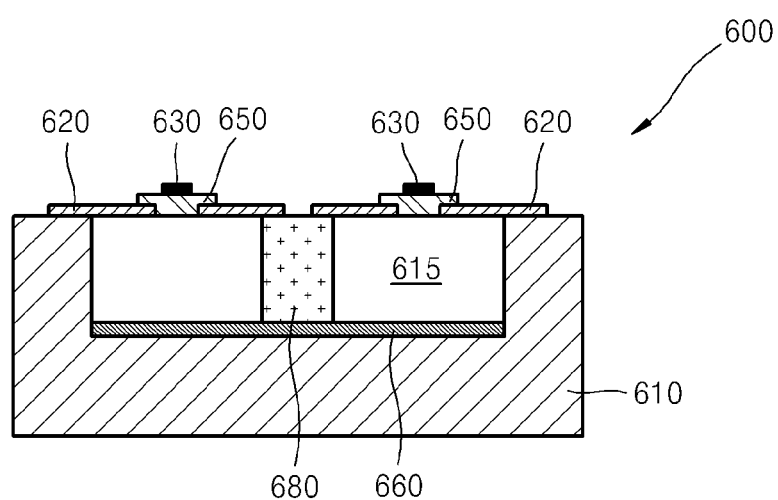
FIG. 12 is a cross-sectional view illustrating the infrared detector of FIG. 11.

FIG. 11 is a top view illustrating an infrared detector 600 according to another example embodiment. FIG. 12 is a cross-sectional view illustrating the infrared detector 600.

Referring to FIGS. 11 and 12, the infrared detector 600 includes a substrate 610 in which a cavity 615 is formed to a certain depth, a plurality of infrared absorbers 630 separated from one another and absorbing infrared rays and generating heat energy in response thereto, and a plurality of thermocouples 620 receiving the heat energy from the plurality of infrared absorbers 630 and generating electromotive forces in response thereto. In this case, the plurality of thermocouples 620 may be provided to be connected in series between the plurality of infrared absorbers 630. Connection parts of the plurality of thermocouples 620 may be supported by at least one post 680 provided in the cavity 615. A mirror layer 660 reflecting infrared rays may be provided on a bottom surface of the cavity 615 formed on the substrate 610. The substrate 610 may be formed as a single body. However, similar to the structure in FIG. 3, the substrate 610 may be formed of first and second substrate (not shown). Rather than the cavity 615, a penetration hole (not shown) may be formed in the substrate 610 in a manner similar to the structure shown in FIG. 8.

Each of the plurality of infrared absorbers 630 may include one of a plasmonic resonator and a metamaterial resonator. Each of the plurality of infrared absorbers 630 may have various structures depending on design requirements. In FIG. 11, for example, each of the plurality of infrared absorbers 630 has a cross structure. A plurality of thermal conductive layers 650 may be provided corresponding to the plurality of infrared absorbers 630. The thermal conductive layers 650 uniformly transfer the heat energy generated from the plurality of infrared absorbers 630 to the plurality of thermocouples 620. Each of the infrared absorbers 630 is provided on each of the thermal conductive layers 650 such that edges of the plurality of thermal conductive layers 630 are in contact with hot junctions of the plurality of thermocouples 620. On the other hand, the plurality of thermal conductive layers 650 may not be provided and the plurality of infrared absorbers 630 may be in direct contact with the plurality of thermocouples 620.

The plurality of thermocouples 620 is connected in series between the plurality of infrared absorbers 630 separated from one another. The connection parts of the plurality of thermocouples 620 may be supported by the at least one post 680 provided in the cavity 615. In this case, cold junctions of the plurality of thermocouples 620 may be in contact with a top surface of the post 680. Also, the hot junctions of the plurality of thermocouples 620 may be in contact with one of the plurality of thermal conductive layers 650 and the plurality of infrared absorbers 630. The post 680 may include a material having high thermal conductivity to function as a heat sink.

The heat energy generated from the infrared absorbers 630 may be effectively emitted via the substrate 610 and the post 680. On the other hand, although not shown in the drawings, a support layer supporting the plurality of thermal conductive layers 650 and the plurality of infrared absorbers 630 may be further provided on the substrate 610. When the penetration hole (not shown) is formed in the substrate 610, the at least one post 680 may be provided in the penetration hole.

The infrared detector 60 may have an improved optical absorption rate due to the inclusion of the plurality of infrared absorbers 630 separated from one another, and thus, the infrared detector 60 having small pixels may be realized.

The thermopile type infrared detectors according to the example embodiments may have a relatively increased infrared absorption rate due to use of one of a plasmonic resonator and a metamaterial resonator as an infrared absorber. Therefore, a sensitivity of the infrared detector may increase. Also, when manufacturing an infrared image sensor by using a plurality of the infrared detectors, thermal images having relatively high quality may be obtained. Also, it is possible to embody an infrared detector having small-sized pixels by using a plurality of infrared absorbers. The infrared detectors may be used in all fields where performing detection via heat energy generated by absorbing infrared rays is required. Also, the infrared detectors, for example, may be used to embody terahertz detectors and terahertz image sensors.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An infrared detector comprising:
   at least one infrared absorber provided on a substrate, the at least one infrared absorber including one of a plasmonic resonator and a metamaterial resonator;
   a plurality of thermocouples configured to generate electromotive forces in response to thermal energy generated by the at least one infrared absorber; and
   at least one thermal conductive layer disposed in the form of a separate layer between the at least one infrared absorber and the plurality of thermocouples, the at least one thermal conductive layer configured to transfer thermal energy generated by the at least one infrared absorber to the plurality of thermocouples.

2. The infrared detector of claim 1, wherein one of a cavity and a penetration hole is formed in the substrate to a depth.

3. The infrared detector of claim 2, further comprising:
   a mirror layer disposed in the cavity, the mirror layer configured to reflect an infrared ray incident thereon.

4. The infrared detector of claim 3, wherein the mirror layer is on a bottom surface of the cavity.

5. The infrared detector of claim 2, wherein the substrate is formed as a single body.

6. The infrared detector of claim 2, wherein the substrate comprises:
   a first substrate and a second substrate, the second substrate disposed on the first substrate and the second substrate having the cavity included therein.

7. The infrared detector of claim 2, wherein the at least one infrared absorber comprises:
   a plurality of infrared absorbers separated from one another, and wherein
   the plurality of thermocouples are provided between the plurality of infrared absorbers, the plurality of thermocouples configured to connect the plurality of thermocouples to one another.

8. The infrared detector of claim 7, further comprising:
   at least one post provided inside one of the cavity and the penetration hole, the at least one post configured to support connection parts of the plurality of thermocouples.

9. The infrared detector of claim 8, wherein cold junctions of the plurality of thermocouples are located on the at least one post.

10. The infrared detector of claim 1, wherein one infrared absorber is disposed on one thermal conductive layer.

11. The infrared detector of claim 1, wherein a plurality of infrared absorbers are disposed on one thermal conductive layer.

12. The infrared detector of claim 1, wherein the thermal conductive layer comprises:
    one of a thermal conductive insulating material and a metal.

13. The infrared detector of claim 1, further comprising:
    a support layer disposed on the substrate and supporting the plurality of thermocouples and the at least one thermal conductive layer.

14. The infrared detector of claim 1, wherein the one of the plasmonic resonator and the metamaterial resonator comprises:
    at least one metal material selected from the group consisting of Au, Ti, Al, Cu, Pt, Ag, Ni, and Cr.

15. The infrared detector of claim 1, wherein the plurality of thermocouples are connected in series.

16. An infrared image sensor comprising:
    an infrared detector, the infrared detector including,
       at least one infrared absorber disposed on a substrate, the at least one infrared absorber including one of a plasmonic resonator and a metamaterial resonator,
       a plurality of thermocouples configured to generate electromotive forces in response to thermal energy generated by the at least one infrared absorber, and
       at least one thermal conductive layer disposed in the form of a separate layer between the at least one infrared absorber and the plurality of thermocouples, the at least one thermal conductive layer configured to transfer thermal energy generated by the at least one infrared absorber to the plurality of thermocouples.

17. The infrared image sensor of claim 16, wherein one of a cavity and a penetration hole is formed in the substrate to a depth.

18. The infrared image sensor of claim 17, wherein the infrared detector further comprises:
    a mirror layer disposed in the cavity, the mirror layer configured to reflect infrared ray incident thereon.

19. The infrared image sensor of claim 17, wherein the at least one infrared absorber comprises:
- a plurality of infrared absorbers separated from one another and connected by the plurality of thermocouples, and wherein
   - at least one post supporting connection parts of the thermocouples is provided inside the one of the cavity and the penetration hole.

20. The infrared image sensor of claim 16, wherein the infrared detector further comprises:
- a support layer disposed on the substrate, the support layer configured to support the at least one thermal conductive layer and the plurality of thermocouples.

\* \* \* \* \*